(12) United States Patent
Li et al.

(10) Patent No.: US 10,818,504 B2
(45) Date of Patent: Oct. 27, 2020

(54) METHOD FOR PRODUCING A PATTERN OF FEATURES BY LITHOGRAPHY AND ETCHING

(71) Applicant: IMEC VZW, Leuven (BE)

(72) Inventors: Waikin Li, Leuven (BE); Danilo De Simone, Leuven (BE); Sandip Halder, Bierbeek (BE); Frederic Lazzarino, Hamme-Mille (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/218,749

(22) Filed: Dec. 13, 2018

(65) Prior Publication Data

US 2019/0189458 A1    Jun. 20, 2019

(30) Foreign Application Priority Data

Dec. 14, 2017 (EP) ..................... 17207209

(51) Int. Cl.
*H01L 21/308* (2006.01)
*G03F 7/20* (2006.01)
*G03F 1/70* (2012.01)

(52) U.S. Cl.
CPC ............ *H01L 21/3086* (2013.01); *G03F 1/70* (2013.01); *G03F 7/2022* (2013.01); *G03F 7/70033* (2013.01); *G03F 7/70466* (2013.01)

(58) Field of Classification Search
None
See application file for complete search history.

(56) References Cited

U.S. PATENT DOCUMENTS

| | | |
|---|---|---|
| 7,981,592 B2 | 7/2011 | Chan |
| 8,541,316 B2 | 9/2013 | Sukekawa |

(Continued)

FOREIGN PATENT DOCUMENTS

| | | |
|---|---|---|
| CN | 105759560 A | 7/2016 |
| KR | 1020130005185 A | 1/2013 |

OTHER PUBLICATIONS

Ghaida, Rani et al., "Single-Mask Double-Patterning Lithography," Proceedings of SPIE, vol. 7488, Sep. 2009, pp. 74882J-1 to 74882J-11.

(Continued)

*Primary Examiner* — Charles D Garber
*Assistant Examiner* — Xiaoming Liu
(74) *Attorney, Agent, or Firm* — McDonnell Boehnen Hulbert & Berghoff LLP

(57) ABSTRACT

A method for producing a pattern of features on a substrate may involve performing two exposure steps on a resist layer applied to the substrate, followed by a single etching step. In the two exposures, the same pattern of mask features is used, but with possibly differing dimensions and with the pattern applied in the second exposure being shifted in position relative to the pattern in the first exposure. The shift, lithographic parameters, and/or possibly differing dimensions are configured such that a number of resist areas exposed in the second exposure overlap one or more resist areas exposed in the first exposure. When the pattern of mask features is a regular 2-dimensional array, the method produces of an array of holes or pillars that is denser than the original array. Varying the mask patterns can produce different etched structure shapes, such as a zig-zag pattern.

17 Claims, 7 Drawing Sheets

(56) References Cited

U.S. PATENT DOCUMENTS

| | | | |
|---|---|---|---|
| 8,993,224 B2 | 3/2015 | Sun et al. | |
| 9,012,330 B2 | 4/2015 | Nair et al. | |
| 9,281,203 B2 | 3/2016 | Chen et al. | |
| 9,455,177 B1 | 9/2016 | Park et al. | |
| 9,543,502 B2 | 1/2017 | Zou et al. | |
| 2002/0172901 A1 | 11/2002 | Tokushima | |
| 2007/0003878 A1 | 1/2007 | Paxton et al. | |
| 2009/0258318 A1* | 10/2009 | Chan | H01L 21/0273 430/312 |
| 2010/0112463 A1 | 5/2010 | Yune | |
| 2013/0089986 A1* | 4/2013 | Park | H01L 21/0274 438/703 |
| 2013/0295772 A1 | 11/2013 | Kim et al. | |
| 2014/0199789 A1 | 7/2014 | Lee et al. | |
| 2016/0307755 A1 | 10/2016 | Kim et al. | |
| 2017/0365531 A1* | 12/2017 | Tedeschi | H01L 22/26 |

OTHER PUBLICATIONS

Singh, Arjun et al., "Using chemo-epitaxial directed self-assembly for repair and frequency multiplication of EUVL contact hole patterns," Proceedings of SPIE, vol. 9049, Mar. 2014, pp. 90492F-1 to 90492F-8.

European Search Report, European Patent Application No. 17207209.2, dated Jun. 6, 2018, 8 pages.

\* cited by examiner

_US 10,818,504 B2_

METHOD FOR PRODUCING A PATTERN OF FEATURES BY LITHOGRAPHY AND ETCHING

CROSS-REFERENCE TO RELATED APPLICATION

The present application is a non-provisional patent application claiming priority to European Patent Application No. 17207209.2 filed Dec. 14, 2017, the contents of which are hereby incorporated by reference.

TECHNICAL FIELD

The present disclosure is related to lithographic processes applied for the patterning of a layer produced in the production of semiconductor devices. In particular examples, the disclosure is related to a method for producing a dense array of pillars or holes, and to the formation of specific pattern shapes.

BACKGROUND

The formation of dense arrays of holes or pillars by lithography and etching is of high importance, for example, for the production of contact arrays in memory chips. EUV (Extreme Ultra Violet) lithography is, today, a primary technology for the production of such arrays. As the size of the contacts diminishes, and thereby the density of the arrays increases, it becomes difficult or impossible to produce the arrays by single exposure EUV lithography because of limitations of the tool resolution capability (i.e., max. Numerical Aperture) and the photoresist performance. An alternative method of forming dense hole or pillar arrays is the decomposition of the final layout of the array in two layers. In this case, the two decomposed layers produce the final patterning on wafer by applying a litho-etch-litho-etch (LELE) approach. LELE is, however, an expensive technique, and it is also subject to limitations in terms of the obtainable array density.

SUMMARY OF THE DISCLOSURE

The present disclosure includes a method that helps address the above-cited problems. The method involves producing a pattern of features on a substrate by lithography and etching. Two exposure steps are performed on a resist layer applied to the substrate, followed by a single etching step. In the two exposures, a mask is used comprising the same pattern of mask features, possibly differing by a scale factor applied to the dimensions of the features, while the pattern applied in the second exposure is shifted relative to the position of the pattern in the first exposure. The shift, the lithographic parameters, and/or the scale factor are such that a number of resist areas corresponding to the mask pattern and created in the second exposure overlap one or more resist areas corresponding to the mask pattern and created in the first exposure. When the pattern of mask features is a regular 2-dimensional array, the method may allow for the production of an array of holes or pillars that is denser than the original array, requiring only one etching step. When other mask patterns are used, different shapes of etched structures can be produced, such as a zig-zag pattern.

In some examples, the present disclosure is related to a method for producing a pattern of features on a substrate by lithography and etching, the method comprising two exposure steps and not more than one etching step following the exposure steps. In the two exposure steps, a lithographic mask is used comprising the same pattern of mask features, possibly with a scale factor applied to the dimensions of the features in the mask used in the second exposure step relative to the dimensions of the features in the mask used in the first exposure step (the scale factor is applied without changing the relative positions of the mask features), to thereby reproduce the pattern of mask features as a first and second pattern of areas in a layer of photoresist applied to the substrate. In the second exposure step, the pattern of mask features can be shifted relative to the position of the pattern of mask features in the first exposure step. Further, one or more of (i) the shift, (ii) the lithographic parameters applied in the first and/or the second exposure steps, or (iii) if applicable, the scale factor, can be configured so that a plurality of areas of the second array of resist areas overlap one or more areas of the first array of resist areas, thereby producing, after development of the photoresist following the second exposure step, a pattern of one or more resist features or open areas formed by said overlapping areas or formed in between said overlapping areas.

In some examples, the pattern of mask features can be a regular array of mask features arranged in rows and columns, and the shift can applied in such a manner that in the second exposure step a plurality of mask features are each lying in between four mask features applied in the first exposure step. Further, each of the resist areas corresponding to the plurality of mask features can overlap four resist areas corresponding to the four mask features, so that the pattern formed by the overlapping areas or in between the overlapping areas is an array of features that is denser than the regular array of mask features, respectively defining a pattern of holes or pillars.

In some examples, one of the masks can include the regular array of mask features on the whole of the substrate surface, while the other mask can include the regular array of mask features on a part of the substrate surface, so that on a first portion of the substrate, a pattern of holes or pillars is formed corresponding to the regular array of mask features, while on a second portion of the substrate, a pattern of respective pillars or holes is formed having a higher density than the regular array of mask features.

In some examples, the pattern of mask features can be a single row or column of mask features, and the shift can be in a direction perpendicular to the row or column, in such a manner that in the second exposure step a plurality of mask features are lying in between two mask features applied in the first exposure step so that the pattern of one or more resist features or open areas formed by the overlapping areas is a zig-zag pattern.

In some examples, a dark field mask can be applied in the first and in the second exposure steps. In these examples, a negative tone resist layer or a positive tone resist layer can be applied to the substrate prior to the first exposure step, and the resist layer is not developed in between the first and second exposure steps.

The mask features of the dark field mask applied in the first exposure step may have the same dimensions as the mask features of the dark field mask applied in the second exposure step, and the lithographic parameters applied in the first and second exposure steps can be configured so that the areas of the second array of resist areas overlap the areas of the first array of resist areas.

In some examples, the same physical mask may be shifted in the second exposure step relative to the position of the mask in the first exposure step.

In some examples, a bright field mask can be used in the first and in the second exposure steps. In these examples, a positive tone resist layer can be applied to the substrate prior to the first exposure step, the first resist layer can be developed after the first exposure step followed by the application of a second positive tone resist layer before performing the second exposure step, and the dimensions of the mask features of the mask applied in the first exposure step can differ from the dimensions of the mask features of the mask applied in the second exposure step.

In some examples, a different mask type and/or a different resist type can be applied in the first and the second exposure steps.

The exposure steps may be performed in an EUV lithography tool. The two exposure steps and the etching step may be performed in the same lithography tool, while the substrate is maintained in a fixed position.

DETAILED DESCRIPTION

According to the present disclosure, a 2-dimensional array of features can be produced by lithography and etching, by subjecting a substrate comprising a photoresist layer on its surface, to two consecutive exposure steps in a lithography tool, followed by a single step of etching the substrate. The mask pattern applied in the two exposure steps can represent the same regular array of mutually identical mask features, arranged in rows and columns, and the rows and columns can be perpendicular to each other. However, the pattern is shifted in the second exposure step with respect to the position of the pattern in the first exposure step. The dimensions of the mask features in the second step may be different by a scale factor relative to the dimensions of the mask features applied in the first step. The single etching step follows the development of the resist layer subjected to the second exposure step. Based on the type of mask and the type of resist used, this resist layer may be the initial resist layer or it may be a second resist layer applied after development of the initial resist layer following the first exposure step. In the present disclosure, the term 'developing the resist' is defined as: removing portions of resist that have been exposed (in the case of a positive tone resist) or that have not been exposed (in the case of a negative tone resist).

In some examples, the mask pattern can be shifted in such a way that a plurality of features of the array of mask features in the second exposure are centrally placed amid the positions of four mask features in the first exposure. The shift of the mask pattern, the dimensions of the mask features applied in the second exposure relative to the mask features applied in the first exposure, and/or the exposure parameters which define the exposure dose applied in the first and second exposures can be configured such that the plurality of resist areas affected respectively by the plurality of mask features in the second exposure step placed centrally amid the four initial mask feature positions are overlapping the four resist areas affected by the four mask features in the first exposure step, thereby creating an array of resist features or open areas formed by or in between the overlapping areas. This latter array is denser than the original array of mask features applied in the first and second exposure steps.

The choice of the mask type (dark field or bright field) and of the resist type (negative or positive tone imaging) affects whether the resulting resist structure is an array of holes or pillars and also whether an additional resist layer should be deposited between the first and second exposure. Several combinations of the two mask types and resist types are, however, possible.

Figure 1A:
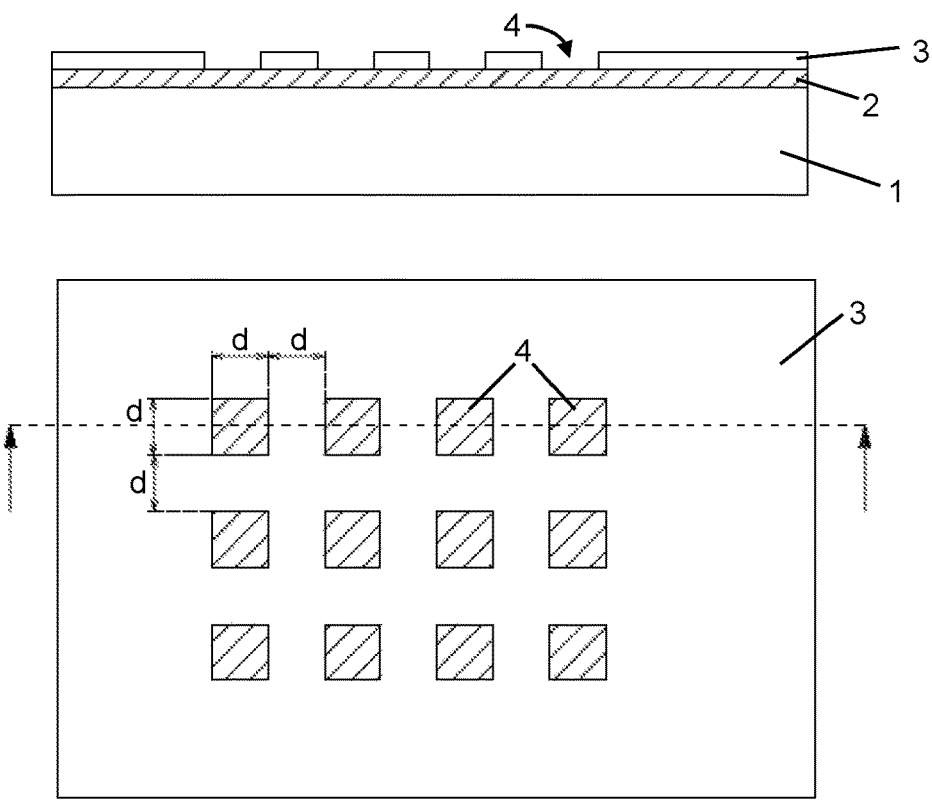
FIG. 1a illustrates a top view and a cross-sectional view of a semiconductor device in a first step of a first process for producing a pattern of features in the semiconductor device, according to an example embodiment.

As an example, the case of a dark field mask combined with a negative tone imaging resist is described hereafter in detail, referring to FIGS. 1a to 1e. The frontal section view in FIG. 1a illustrates a substrate 1 comprising a negative tone photoresist layer 2 on its surface. A dark field lithographic mask 3 is placed over the resist layer 2. As shown, the mask 3 is in contact with the resist 2, but in other examples, the mask 3 may alternatively be placed at a distance from the resist 2. FIGS. 1a to 1e may show only a portion of the mask 3, the substrate 1, and the resist layer 2 which may, in examples, extend beyond the surface illustrated in the figures. The top view of FIG. 1a shows the layout of the mask 3, comprising a regular array of square openings 4 having a side dimension d, which is also the distance between adjacent sides of two adjacent squares in the array. The mask is a dark field mask, i.e., the mask blocks light over the full surface of the resist layer 2 except on the surface of the openings 4. FIG. 1a shows the substrate-mask assembly before exposure in a lithographic tool.

Figure 1B:
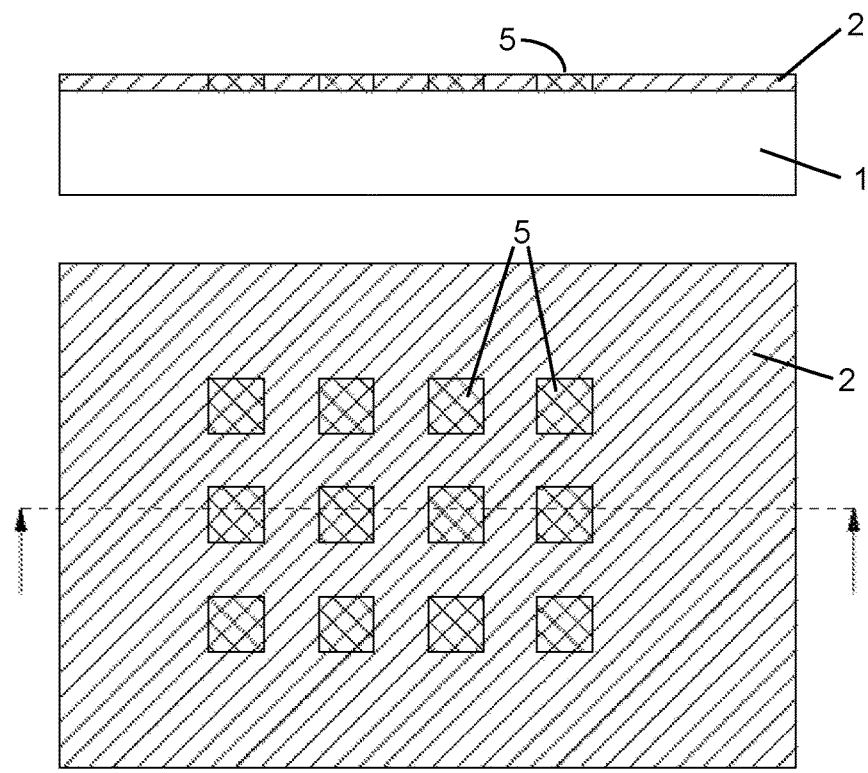
FIG. 1b illustrates a top view and a cross-sectional view of the semiconductor device in a second step of the first process for producing the pattern of features in the semiconductor device, according to an example embodiment.
Figure 1C:
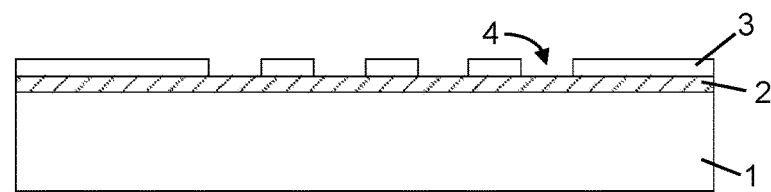
FIG. 1c illustrates a top view and a cross-sectional view of the semiconductor device in a third step of the first process for producing the pattern of features in the semiconductor device, according to an example embodiment.
Figure 1C:
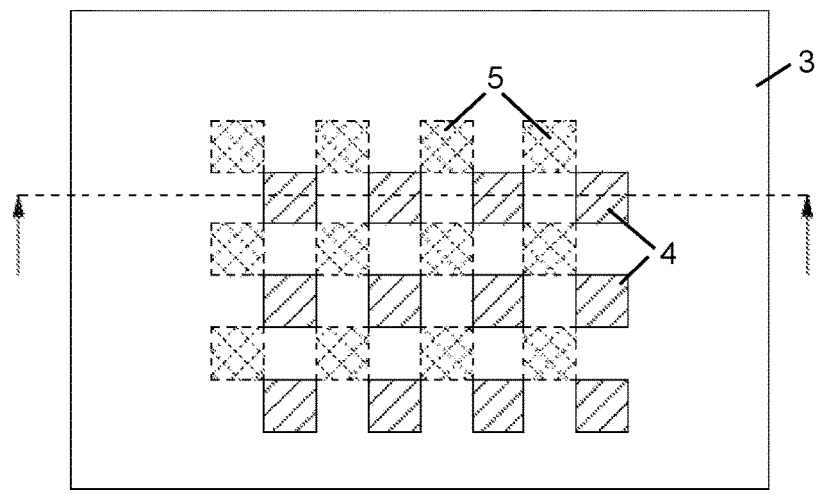
Figure 1C:
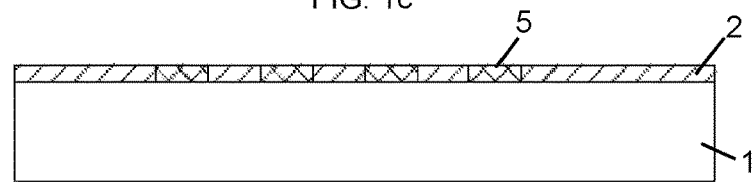
Figure 1D:
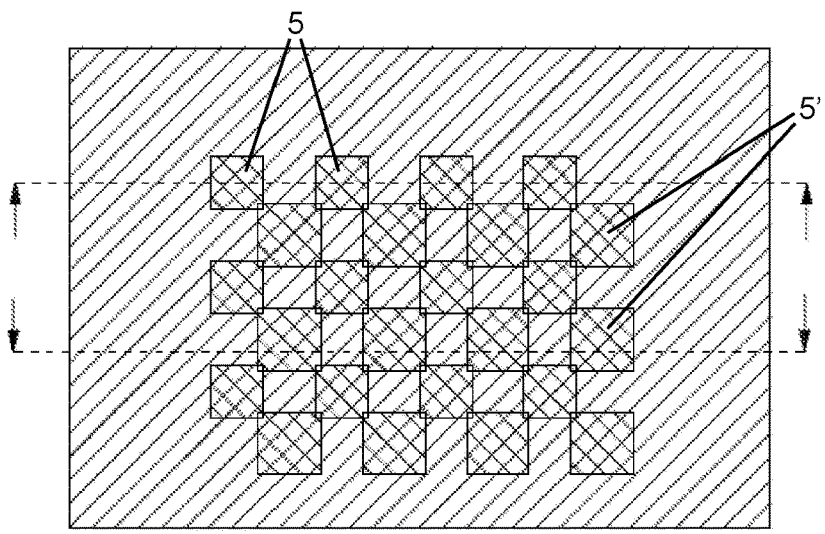
FIG. 1d illustrates a top view and two cross-sectional views of the semiconductor device in a fourth step of the first process for producing the pattern of features in the semiconductor device, according to an example embodiment.
Figure 1D:
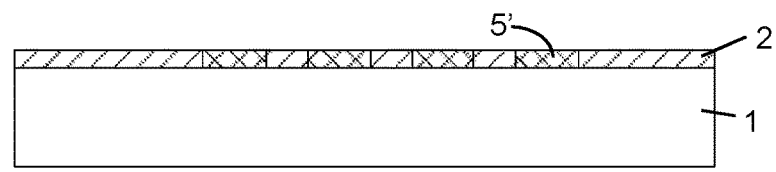

FIG. 1b shows the effect of the exposure, and after removal of the mask 3. The negative tone resist 2 has hardened under the illumination effect, in the areas 5 corresponding to the openings 4, as symbolized by the different hatching type of the hardened resist areas 5. The rest of the surface is still covered by negative tone resist 2 which has not been exposed. As shown, the dimensions of the hardened resist areas 5 are equal or substantially similar to the dimensions of the mask openings 4. However, the dimensions of the hardened resist areas 5 may differ from the mask openings 4, depending on the lithographic parameters applied during the exposure. In the next step of this particular example, the mask 3 is again applied but shifted with respect to its initial position, as shown in FIG. 1c. As seen in the top view, the mask 3 is shifted downward and to the right, in such a manner that six of the mask openings 4 are now centrally placed amid respective sets of four of the original mask opening locations, illustrated in dotted lines in FIG. 1c. Another exposure is performed, resulting in the formation of hardened resist areas 5', as seen in FIG. 1d. The exposure parameters are configured so that the hardened resist areas 5' are larger by a given scale factor than the mask openings 4. The exposure parameters are adjusted in such a way that the received exposure dose during the second exposure is higher than during the first exposure, resulting in the larger areas 5'. The details of how the dose may be controlled are known to a person of ordinary skill in the art and are not described in detail here.

Due to the scale factor, six of the hardened areas 5' resulting from the second exposure overlap the hardened areas 5 of the first exposure in the four corner regions of the six hardened areas 5'. After development, i.e., removal of the non-exposed resist 2, the hardened resist areas 5 and 5' form the pattern illustrated in FIG. 1e. The pattern defines an array of rectangular holes 10 between the overlapping resist areas. This resist pattern is thus suitable for etching a pattern of holes in the underlying substrate 1 according to these rectangular openings 10. The array of rectangular openings 10 is denser than the original array of openings 4 defined by the mask 3. A dense array of openings can thus be created by this method, without necessarily using more than one etching step.

Instead of using the same mask 3 and shifting it with respect to the mask position in the first exposure step, a different mask may be applied in the second exposure step. The second mask can define, however, the same or substantially the same array of square features 4 in terms of their mutual distance (as measured between the centers of adjacent squares of the array), but in the second mask the array is shifted with respect to the first mask. In some examples, the dimensions of the squares in the second mask may be larger than the squares of the first mask, so that the overlap is not only obtained by the particular choice of exposure parameters, but also by the larger dimensions of the squares in the second mask. Alternatively, the dimensions of the squares in the first mask could be larger than the dimensions of the squares in the second mask. In some examples, the exposure parameters during the first exposure could be configured so that the hardened areas 5 are larger than the openings 4. In these examples, the second exposure could be done with the openings 4 or with openings larger than the openings 4. It should be apparent that various combinations of feature dimensions and exposure parameters can be employed to obtain the overlapping resist features shown in FIG. 1e.

Figure 1E:
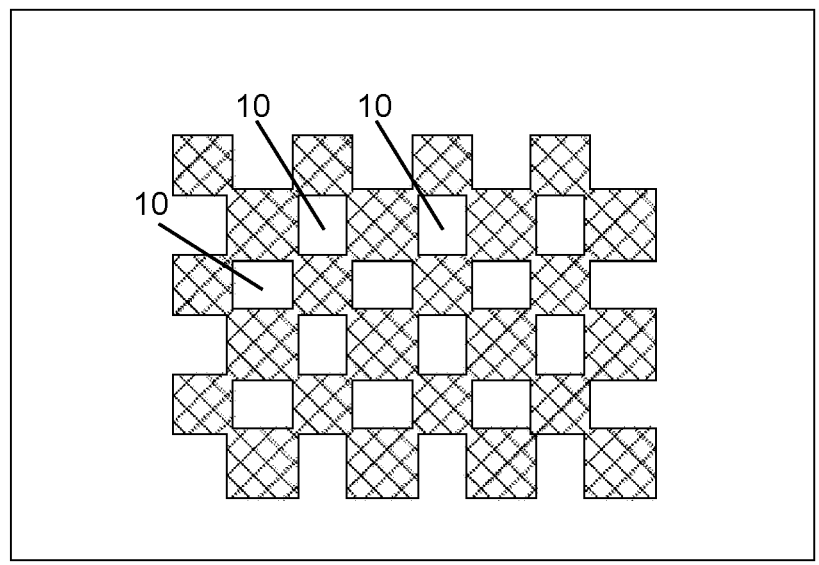
FIG. 1e illustrates a top view of the semiconductor device in a fifth step of the first process for producing the pattern of features in the semiconductor device, according to an example embodiment.

It should also be understood that using a positive tone resist layer combined with the same dark field mask of FIG. 1a results in a resist pattern that is the negative of the pattern shown in FIG. 1e. In other words, this pattern will exhibit pillars in the rectangular areas 10 instead of holes. This resist pattern is thereby suitable for etching the underlying substrate 1 to obtain a pattern of pillars in an upper layer of the substrate.

Likewise, when a bright field mask is used instead of a dark field mask, the use of a positive tone imaging resist yields a resist pattern defined by a pattern of holes, like the pattern shown in FIG. 1e. The use of a bright field mask, however, may involve development of the resist after the first exposure step and deposition of a second resist layer before the second exposure step, as illustrated in FIGS. 2a to 2e.

Figure 2A:
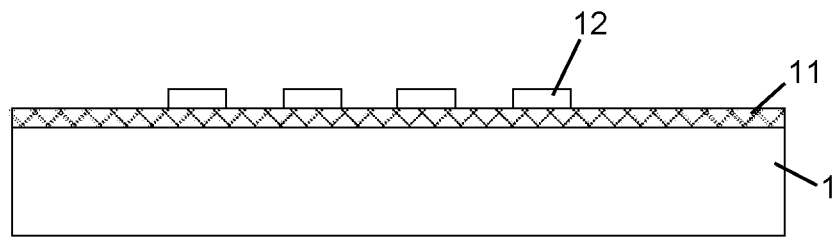
FIG. 2a illustrates a top view and a cross-sectional view of a semiconductor device in a first step of a second process for producing a pattern of features in the semiconductor device, according to an example embodiment.
Figure 2A:
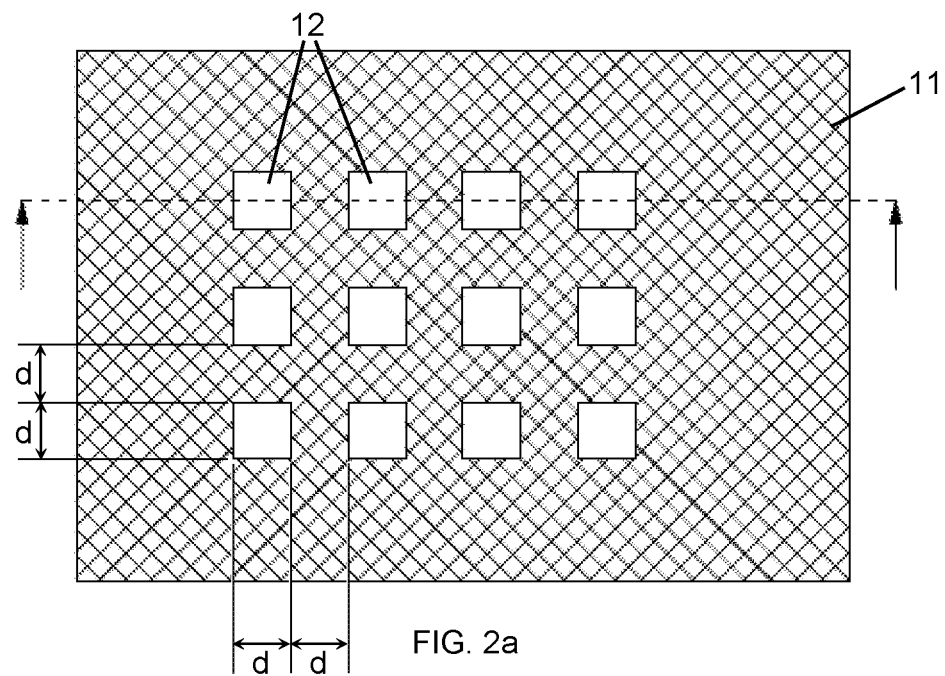
Figure 2B:
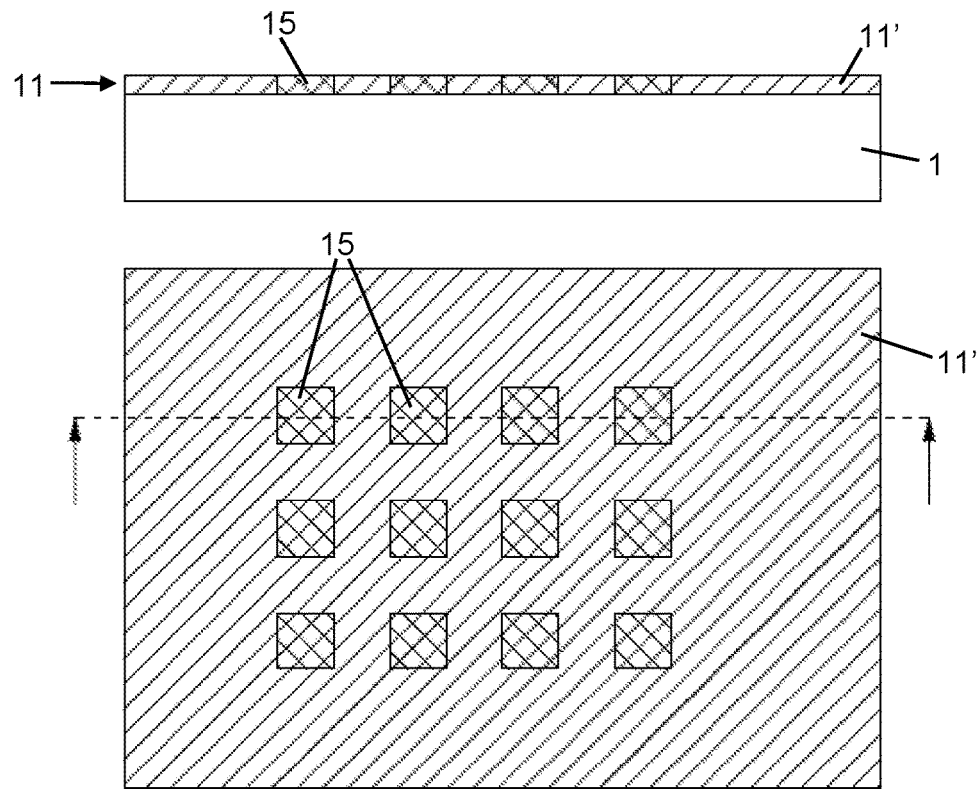
FIG. 2b illustrates a top view and a cross-sectional view of the semiconductor device in a second step of the second process for producing the pattern of features in the semiconductor device, according to an example embodiment.
Figure 2C:
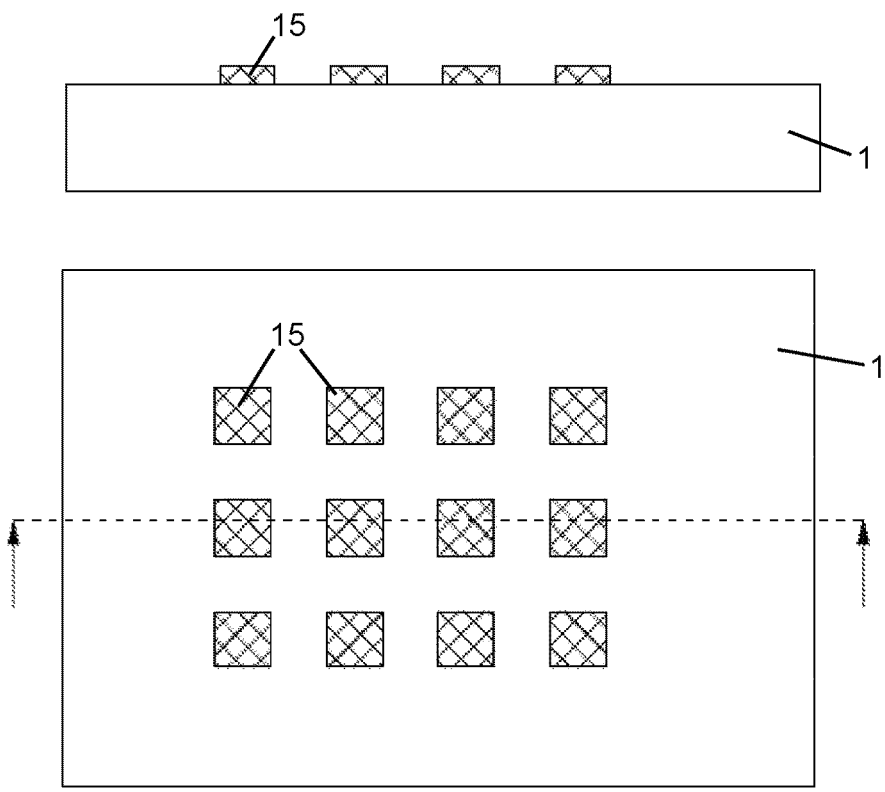
FIG. 2c illustrates a top view and a cross-sectional view of the semiconductor device in a third step of the second process for producing the pattern of features in the semiconductor device, according to an example embodiment.
Figure 2D:
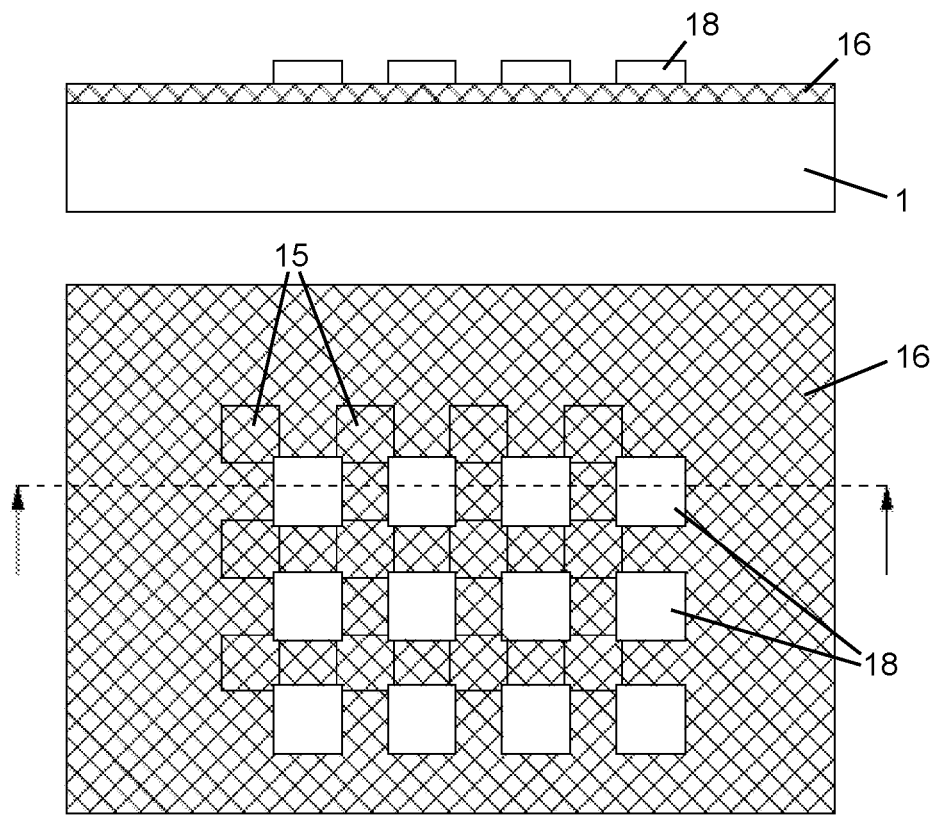
FIG. 2d illustrates a top view and a cross-sectional view of the semiconductor device in a fourth step of the second process for producing the pattern of features in the semiconductor device, according to an example embodiment.
Figure 2E:
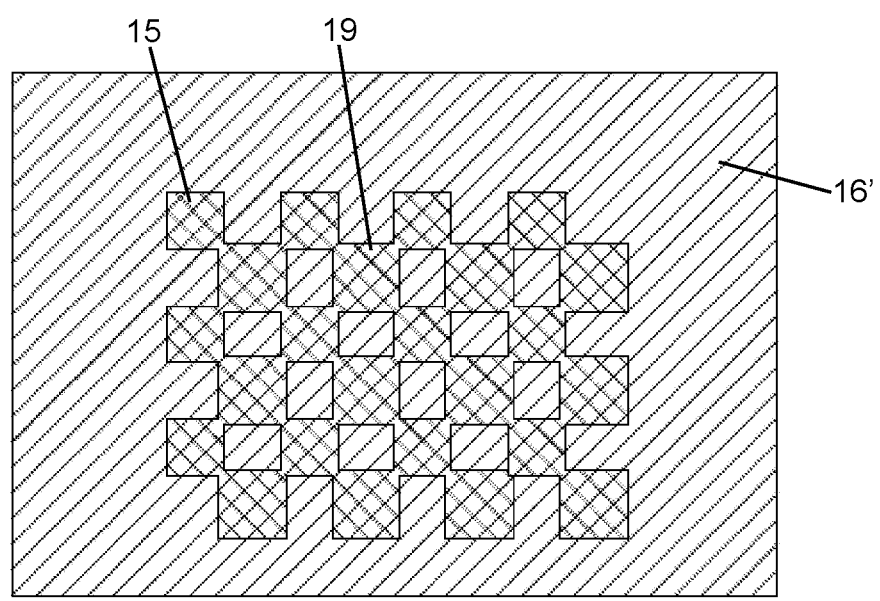
FIG. 2e illustrates a top view of the semiconductor device in a fifth step of the second process for producing the pattern of features in the semiconductor device, according to an example embodiment.

FIG. 2a shows the same substrate 1, now provided with a positive tone imaging resist layer 11, and with a bright field mask, which comprises an array of square mask features 12 of the same side dimension d and arranged at the same mutual distance d as the array of openings 4 in the mask 3 of FIG. 1a. The positive tone resist is hard by default and is rendered removable when exposed. The exposure of this assembly and the removal of the mask 12 results in the arrangement illustrated in FIG. 2b. The resist layer 11 is rendered removable everywhere (hatched region 11') except in the square patches 15 where it was covered by the mask features 12. Development of the resist layer 11 results in the assembly shown in FIG. 2c. Only the square patches 15 remain on the substrate 1. Then a second positive tone resist layer 16 is applied, and a second mask is applied as well, as shown in FIG. 2d. The second mask comprises an array of squares 18 placed at the same or substantially the same relative distances from each other (as measured between their centers) as the first mask features 12, but with the dimensions of the squares being larger by a scale factor, relative to the squares 12 of the first mask. In addition, the pattern of squares 18 of the second mask is shifted downward and to the right relative to the pattern of squares 12 of the first mask, so that six of the larger squares 18 are placed centrally between respective sets of four of the square patches 15 created by the first exposure, and so that these six larger squares 18 overlap the respective sets of four square patches 15 in their corner regions. A second exposure follows, resulting in the arrangement shown in FIG. 2e after removal of the mask (only top view shown). The second resist layer is rendered removable everywhere (hatched regions 16') except on the patches 15 remaining after the first exposure and development of the first resist, and except on the patches 19 that had been covered by the second mask. When the second resist is developed, the result is identical or substantially similar to the arrangement shown in FIG. 1e.

Accordingly, performing the steps described above in connection with FIGS. 1a to 1e and FIGS. 2a to 2e may reproduce the same pattern of features (possibly with a scale factor applied to the dimensions of the features) as a pattern of areas in a resist layer, in two consecutive exposure steps, but in such a manner that the resist areas of the second pattern overlap the resist areas of the first pattern, to thereby create a pattern of resist features or openings 10 in the resist layer, that is different from the original pattern.

Figure 3A:
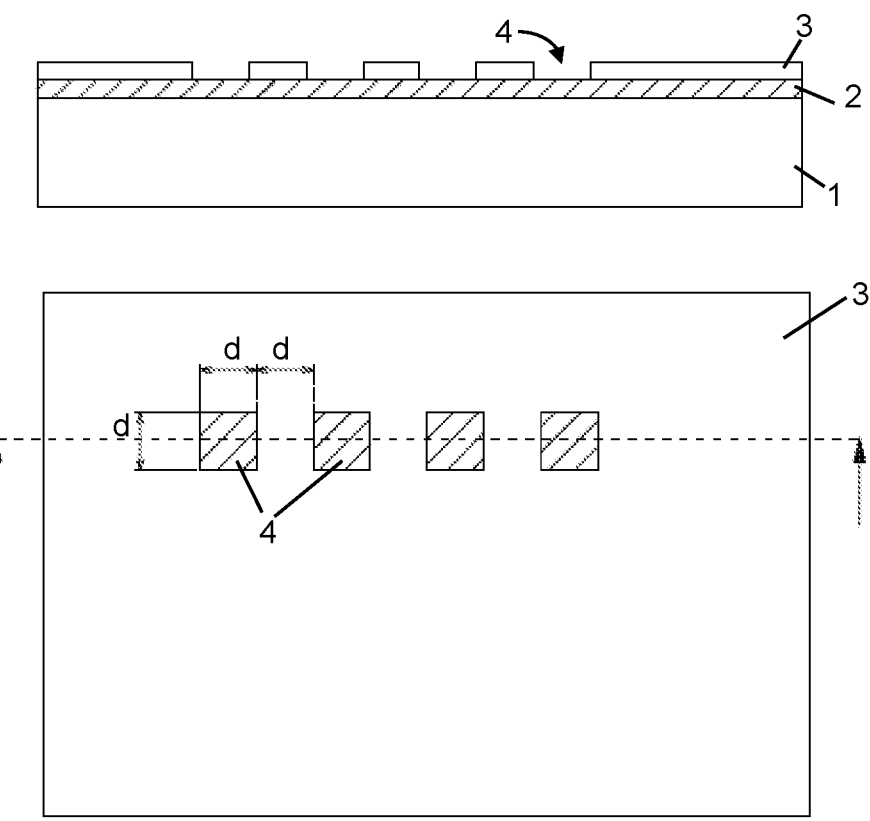
FIG. 3a illustrates a top view and a cross-sectional view of a semiconductor device in a first step of a third process for producing a pattern of features on the semiconductor device, according to an example embodiment.
Figure 3B:
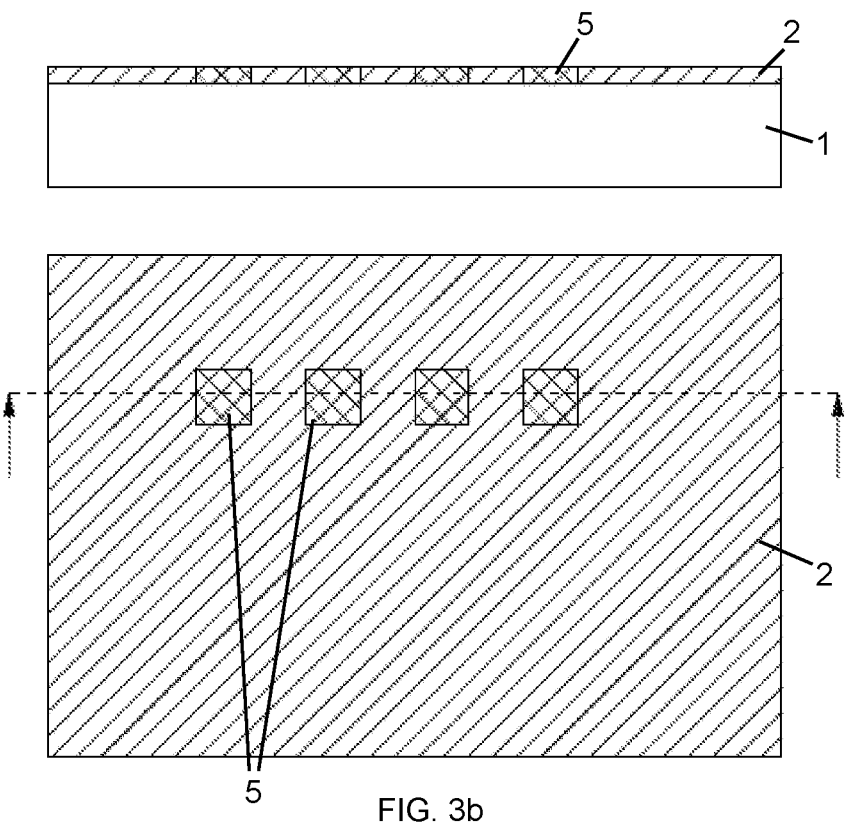
FIG. 3b illustrates a top view and a cross-sectional view of the semiconductor device in a second step of the third process for producing the pattern of features on the semiconductor device, according to an example embodiment.
Figure 3C:
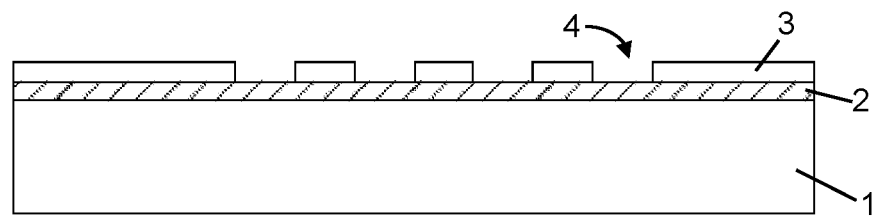
FIG. 3c illustrates a top view and a cross-sectional view of the semiconductor device in a third step of the third process for producing the pattern of features on the semiconductor device, according to an example embodiment.
Figure 3C:
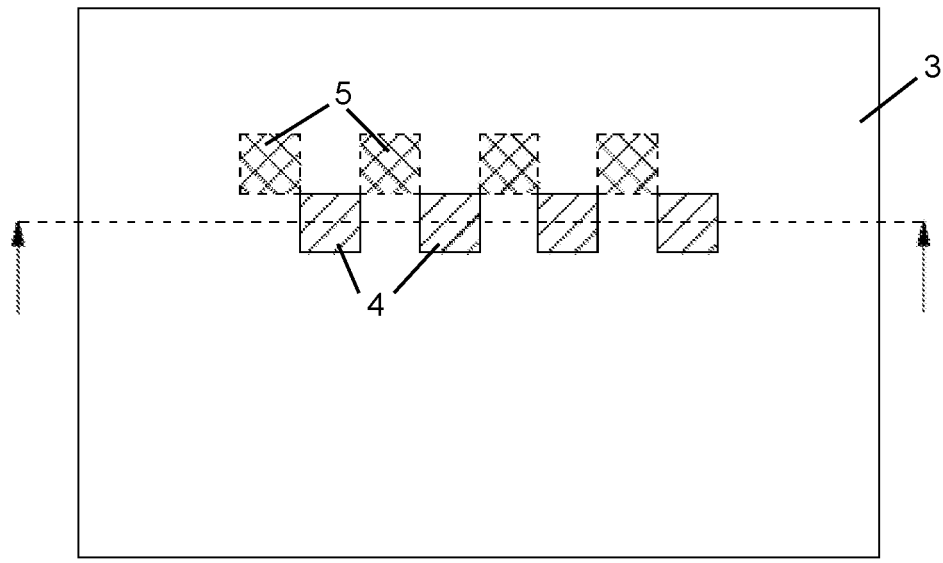
Figure 3D:
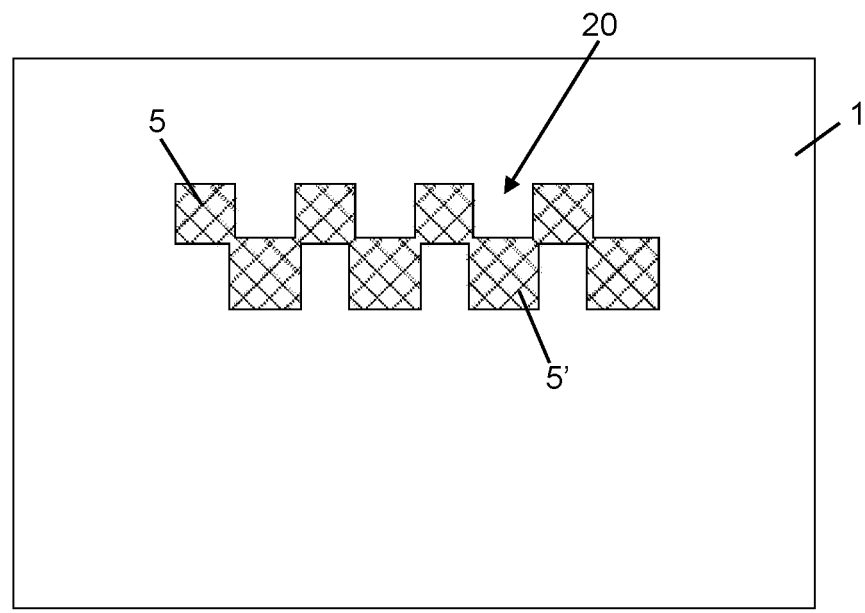
FIG. 3d illustrates a top view of the semiconductor device in a fourth step of the third process for producing the pattern of features on the semiconductor device, according to an example embodiment.

The resulting pattern may be an array of holes or pillars of higher density than the original pattern, as described above. However, other patterns may be created as well. An example of this is illustrated in FIGS. 3a to 3d. Referring to FIG. 3a, a negative tone resist 2 is combined with a dark field mask 3 in a manner such that a first array of mask features is a single row of square-shaped openings 4 having side dimension d and placed at mutual distances d between adjacent sides. After a first exposure, the resulting arrangement is a corresponding array of hardened resist features 5, as shown in FIG. 3b. Referring next to FIG. 3c, in a second exposure step, the mask is shifted downward and to the right (when viewed from above), so that three of the mask openings 4 of the array are arranged below and centrally between respective pairs of hardened resist areas 5. A second exposure step is performed such that resulting hardened resist areas 5' overlap the resist areas 5 created by the first exposure. After development, a zig-zag shaped resist structure 20 remains, as shown in FIG. 3d, which can be reproduced on the substrate by etching. Accordingly, the present disclosure can be used to create various shapes, including a zig-zag structure, using only one etching step. Other structures may be formed as well using the processes described herein, depending on the shape of the mask features.

In the examples described above, the lithography tool used can be an EUV tool. The substrate can be maintained in a fixed position in the lithography tool during the first and second exposure steps, with either the same mask being shifted between the first and second exposure, or the first mask being removed after the first exposure and replaced by a second mask. By maintaining the substrate in a fixed position, overlay errors may be reduced.

The present disclosure makes it possible to produce a region of holes and a region of pillars on the same wafer. This may be done by using a first mask in the first exposure step that defines an array of openings or holes in the resist, across the full surface of the substrate. The second mask can include the same array as the first mask, but shifted in position as described above, and only a on a part of the substrate surface. On the rest of the surface, the second mask can include no mask features (for example, in the case of a dark field mask, the mask can cover the full surface of the rest of the substrate). As a result, on one part of the substrate surface, the dense array of holes or pillars can be created as described above, while on the rest of the substrate, a less dense array of respective pillars or holes can be created. It is also possible to use a first mask with features on a part of the substrate, and a second mask with features over the full surface of the substrate, shifted relative to the features of the first mask.

In some examples, different mask types and resist types could be combined. For example, if the non-exposed negative type resist 2 in FIG. 1b is removed (i.e., after the first exposure step), a positive type resist could be applied in the remaining areas, and the second exposure could be done using a bright field mask. The result is once again the resist structure shown in FIG. 1e.

While the invention has been illustrated and described in detail in the drawings and foregoing description, such illustration and description are to be considered illustrative and not restrictive. Other variations to the disclosed embodiments can be understood and effected by persons of ordinary skill in the art, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used.

What is claimed is:

1. A method for producing a pattern of features on a surface of a substrate by lithography and etching, the method comprising:
    performing a first exposure step, wherein performing the first exposure step comprises using a first lithographic mask comprising first mask features arranged in a first pattern to reproduce the first pattern of the first mask features in a first area of a layer of photoresist applied to the substrate surface;
    performing a second exposure step, wherein performing the second exposure step comprises using a second lithographic mask comprising second mask features arranged in the first pattern to reproduce the first pattern of the second mask features in a second area of the layer of photoresist applied to the substrate surface, wherein the second mask features are shifted in position relative to the first area, wherein one or more dimensions of the second mask features are scaled in size relative to one or more dimensions of the first mask features, and wherein the second area partially overlaps the first area as a result of both the shift in position of the second mask features and the dimensions of the second mask features being scaled in size;
    developing the photoresist layer to produce a second pattern of (i) photoresist features or (ii) open areas in the photoresist layer, wherein the second pattern is defined by the partial overlapping of the first and second areas; and
    performing not more than one etching step following the first and second exposure steps and the developing of the photoresist layer.

2. The method according to claim 1, wherein the first area comprises a first regular array of areas corresponding to the first mask features arranged in first rows, and first columns, wherein the second mask features are shifted in position relative to the first area in such a manner that the second area comprises a second regular array of areas corresponding to the second mask features, and wherein at least some areas of the second regular array of areas are each lying in between and partially overlapping four areas of the first regular array of areas, such that the second pattern defined by the partial overlapping of the first and second areas is denser than the first pattern.

3. The method according to claim 2, wherein the first regular array of areas is arranged in the first rows and the first columns across the whole of the substrate surface, and wherein the second regular array of areas is arranged in the second rows and the second columns only on a part of the substrate surface, so that the second pattern is produced only on the part of the substrate surface, while the first pattern is produced on the remainder of the substrate surface.

4. The method according to claim 1, wherein the first area comprises a single row or column of areas corresponding to the first mask features, and wherein the second mask features are shifted in position relative to the first area in a direction diagonal to the row or column, such that the second, area comprises a plurality of areas corresponding to the second mask features that are each lying in between and partially overlapping two areas of the single row or column of areas corresponding to the first mask features, and such that the second pattern defined by the partial overlapping of the first and second areas comprises a zigzag pattern.

5. The method according to claim 1, further comprising applying the photoresist layer to the substrate surface.

6. The method according to claim 5, wherein the first and second lithographic masks comprise a dark field mask, wherein applying the photoresist layer to the substrate surface comprises applying the photoresist layer to the substrate surface prior to performing the first exposure step, wherein the photoresist layer comprises a negative tone resist layer or a positive tone resist layer, and wherein developing the photoresist layer comprises developing the photoresist layer after performing both the first and second exposure steps.

7. The method according to claim 5, wherein the first and second lithographic masks comprise a bright field mask, wherein the photoresist layer comprises a first photoresist layer and a second photoresist layer, wherein applying the photoresist layer to the substrate surface comprises applying the first photoresist layer to the substrate surface prior to performing the first exposure step, wherein the first photoresist layer comprises a positive tone resist layer, wherein developing the photoresist layer comprises developing the first photoresist layer after performing the first exposure step.

8. The method according to claim 7, wherein applying the photoresist layer to the substrate surface further comprises applying the second photoresist layer after developing the first photoresist layer, wherein the second photoresist layer is a positive tone resist layer, and wherein developing the photoresist layer further comprises developing the second photoresist layer after performing the second exposure step.

9. The method according to claim 1, wherein the first lithographic mask is a different mask type from the second lithographic mask.

10. The method according to claim 1, wherein the photoresist layer comprises a first photoresist layer and a second photoresist layer that is a different resist type from the first photoresist layer.

11. The method according to claim 1, wherein performing the first and second exposure steps comprises, performing the first and second exposure steps in an extreme ultraviolet (EUV) lithography tool.

12. The method according to claim 1, wherein performing the first and second exposure steps and the etching step comprises performing the first and second exposure steps and the etching step in the same lithography tool while the substrate is maintained in a fixed position.

13. The method according to claim 1, wherein performing the not more than one etching step comprises etching the substrate surface to produce a plurality of pillars or holes in the substrate surface corresponding to the second pattern of photoresist features or open areas in the photoresist layer.

14. The method according to claim 1, wherein a first dimension of the second mask features and a second dimension of the second mask features are scaled in size relative to a first dimension of the first mask features and a second dimension of the first mask features.

15. The method according to claim 14, wherein the first dimension of the second mask features is perpendicular to a second dimension of the second mask features.

16. The method according to claim 1, wherein the one or more dimensions of the second mask features are scaled in size relative to one or more dimensions of the first mask features over the entireties of the second mask features.

17. The method according to claim 1, wherein the one or more dimensions of the second mask features are scaled in size relative to one or more dimensions of the first mask features by a scale factor.

* * * * *